US012723325B2

(12) United States Patent
Zhang et al.

(10) Patent No.: US 12,723,325 B2
(45) Date of Patent: Sep. 1, 2026

(54) DUAL REFRIGERATION SYSTEMS FOR A MONO-CRYSTAL FURNACE AND METHODS FOR PULLING A MONO-CRYSTAL

(71) Applicant: TCL ZHONGHUAN RENEWABLE ENERGY TECHNOLOGY CO., LTD., Tianjin (CN)

(72) Inventors: Wenxia Zhang, Tianjin (CN); Shengli Wang, Tianjin (CN); Yanjie Zhou, Tianjin (CN); Shufeng Zhang, Tianjin (CN); Lin Wang, Tianjin (CN); Mingyang Gong, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 326 days.

(21) Appl. No.: 18/553,484

(22) PCT Filed: Jun. 26, 2023

(86) PCT No.: PCT/CN2023/102450

§ 371 (c)(1),
(2) Date: Sep. 29, 2023

(87) PCT Pub. No.: WO2024/002016

PCT Pub. Date: Jan. 4, 2024

(65) Prior Publication Data

US 2025/0075367 A1 Mar. 6, 2025

(30) Foreign Application Priority Data

Jun. 30, 2022 (CN) ......................... 202210761880.9

(51) Int. Cl.
*C30B 15/20* (2006.01)
*C30B 29/06* (2006.01)

(52) U.S. Cl.
CPC ............ *C30B 15/206* (2013.01); *C30B 29/06* (2013.01)

(58) Field of Classification Search
CPC ....... C30B 15/14; C30B 15/20; C30B 15/206; C30B 29/06
See application file for complete search history.

(56) References Cited

U.S. PATENT DOCUMENTS 1,979,732 A * 11/1934 Carson, Jr. .............. F28F 27/00 165/300
4,261,415 A * 4/1981 Smith, Jr. ............... B30B 15/34 165/47

(Continued)

FOREIGN PATENT DOCUMENTS

CN 203561244 U * 4/2014 ............... F28D 7/04
CN 108624950 A 10/2018

(Continued)

OTHER PUBLICATIONS

English computer translation of CN-113652736-A (Year: 2025).*

(Continued)

*Primary Examiner* — Matthew J Song
(74) *Attorney, Agent, or Firm* — PV IP PC; Wei Te Chung

(57) ABSTRACT

Dual refrigeration systems for a mono-crystal furnace and methods for pulling a mono-crystal. The first heat exchange assembly includes a first heat exchange mechanism capable of exchanging heat, and a first heat exchange channel and a second heat exchange channel communicating with the first heat exchange mechanism. The second heat exchange assembly includes a second heat exchange mechanism capable of exchanging heat, and a third heat exchange channel and a fourth heat exchange channel communicating with the second heat exchange mechanism. The second heat exchange channel and the fourth heat exchange channel are (Continued)

communicated with a cooling assembly of a water-cooled jacket and a cooling assembly of a mono-crystal furnace, respectively. A first fluid is introduced into the first heat exchange channel. A second fluid is circulated in the second heat exchange channel, cooling assembly of water-cooled jacket, the fourth heat exchange channel, and cooling assembly of mono-crystal furnace.

15 Claims, 1 Drawing Sheet

(56) References Cited

U.S. PATENT DOCUMENTS

| | | | | |
|---|---|---|---|---|
| 2010/0024716 | A1 * | 2/2010 | Orschel | C30B 15/22 117/15 |
| 2010/0135888 | A1 * | 6/2010 | Fishman | C01B 33/037 422/245.1 |

FOREIGN PATENT DOCUMENTS

| | | | | | |
|---|---|---|---|---|---|
| CN | 110983431 | A | * | 4/2020 | C30B 15/24 |
| CN | 112746311 | A | | 5/2021 | |
| CN | 113652736 | A | * | 11/2021 | C30B 29/06 |
| KR | 20050057815 | A | | 6/2005 | |
| KR | 20060135190 | A | | 12/2006 | |

OTHER PUBLICATIONS

English computer translation of CN-203561244-U (Year: 2025).*
English computer translation of CN-110983431-A (Year: 2025).*
International Search Report in International application No. PCT/CN2023/102450, mailed on Sep. 22, 2023.
Written Opinion of the International Search Authority in International application No. PCT/CN2023/102450, mailed on Sep. 22, 2023.

* cited by examiner

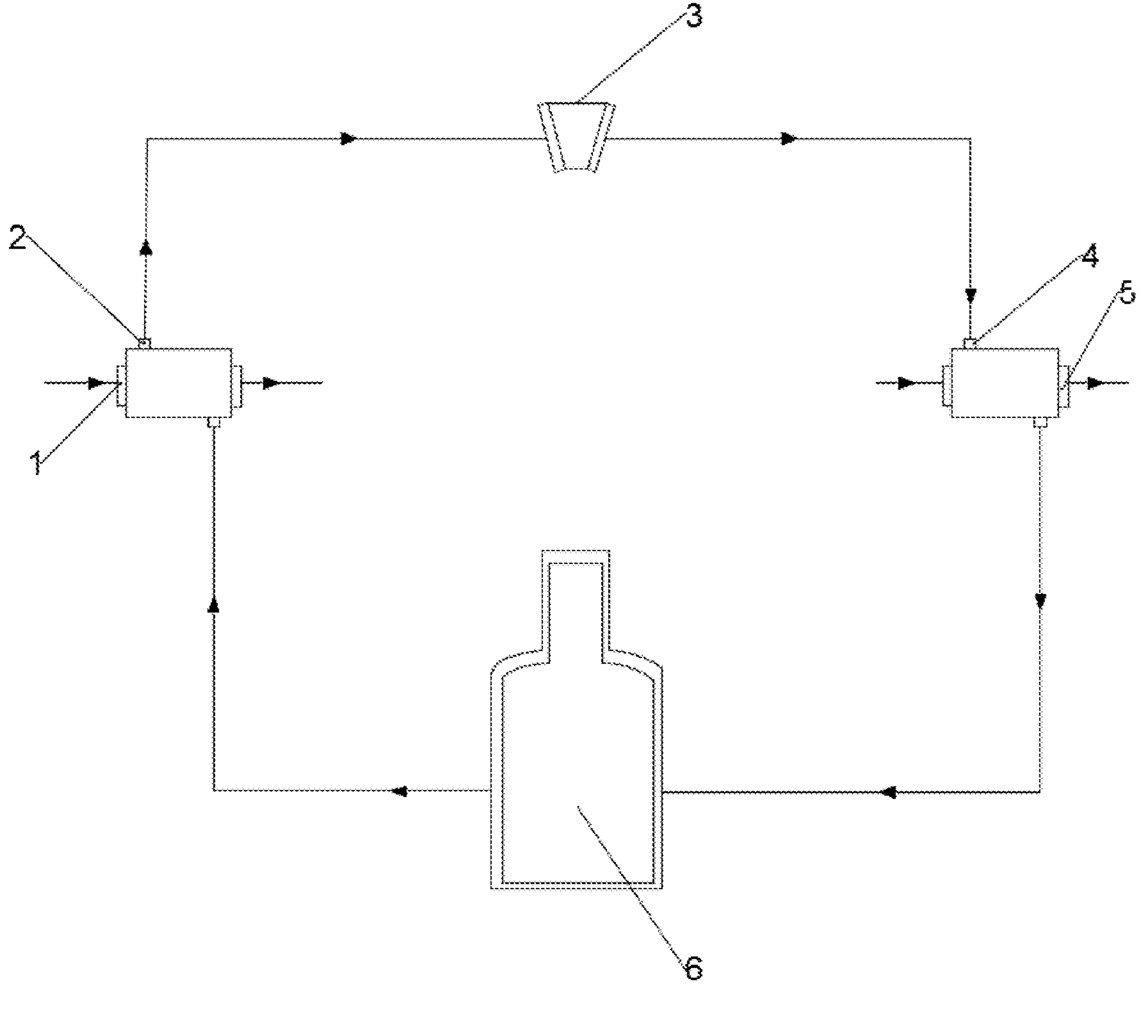
3
2
4
5
1
6

DUAL REFRIGERATION SYSTEMS FOR A MONO-CRYSTAL FURNACE AND METHODS FOR PULLING A MONO-CRYSTAL

CROSS-REFERENCE TO RELATED APPLICATION

The present disclosure claims priority to and the benefit of Chinese Patent Application No. 2022107618809, filed on Jun. 30, 2022, the disclosure of which is incorporated herein by reference in its entirety.

TECHNICAL FIELD

The present disclosure relates to the technical field of preparing a mono-crystal, and in particular, to dual refrigeration systems used for a mono-crystal furnace and methods for pulling a mono-crystal.

BACKGROUND

Currently, two mainstream methods of growing mono-crystals are zone melting method and Czochralski method. No matter which method, requirements for temperature in the whole growth process of mono-crystal silicon are very strict. The melting process of solid polysilicon into silicon melt requires heating the system, and an operating temperature in a furnace is generally about 1400° C. to 1600° C. The molten polysilicon melt needs to be solidified and grown into mono-crystal silicon at a temperature of 500° C. to 1400° C. In order to ensure growth balance and less thermal stress of the mono-crystal in a high-temperature environment, and to ensure growth efficiency of the mono-crystal, it is necessary to add a refrigeration system in the mono-crystal furnace, so that excess heat of crystal accessories is taken away on the one hand, and heat on the surface of the mono-crystal is quickly dissipated to ensure the temperature gradient required for the crystal growth. However, disadvantage is that circulating water of a furnace body and a water-cooled jacket used in the conventional mono-crystal furnace is water from the same line, and the water temperature is the same. The water-cooled jacket refrigeration system adopts a low-temperature method to take away the heat, but at the same time, it is easy to cause the furnace body temperature to be too low, resulting in excessive loss of heat energy in the furnace platform and energy consumption loss.

SUMMARY

In view of the above problems, the present disclosure provides a dual refrigeration system for a mono-crystal furnace and a method of pulling mono-crystals to solve the above or other problems of the prior art.

In order to solve the above problems, the present disclosure provides technical solutions as follows: dual refrigeration systems used for a mono-crystal furnace, comprising a cooling assembly of a water-cooled jacket, a cooling assembly of a mono-crystal furnace, a first heat exchange assembly, and a second heat exchange assembly, wherein

- the first heat exchange assembly includes a first heat exchange mechanism capable of exchanging heat, a first heat exchange channel and a second heat exchange channel, both the first heat exchange channel and the second heat exchange channel are communicated with the first heat exchange mechanism, and the second heat exchange channel is communicated with the cooling assembly of the water-cooled jacket and the cooling assembly of the mono-crystal furnace, respectively;
- the second heat exchange assembly includes a second heat exchange mechanism capable of exchanging heat, a third heat exchange channel and a fourth heat exchange channel, both the third heat exchange channel and the fourth heat exchange channel are communicated with the second heat exchange mechanism, and the fourth heat exchange channel is communicated with the cooling assembly of the water-cooled jacket and the cooling assembly of the mono-crystal furnace, respectively;
- a first fluid is filled into the first heat exchange channel and flows out therefrom;
- a second fluid is circulated in the second heat exchange channel, the cooling assembly of the water-cooled jacket, the fourth heat exchange channel, and the cooling assembly of the mono-crystal furnace;
- a third fluid is filled into the third heat exchange channel and flows out therefrom;
- during the circular flowing process, the second fluid exchanges heat with the first fluid from the first heat exchange channel in the first heat exchange mechanism, exchanges heat with a mono-crystal furnace in the cooling assembly of the water-cooled jacket, exchanges heat with the third fluid form the third heat exchange channel in the second heat exchange mechanism, and exchanges heat with heat in a mono-crystal furnace in the cooling assembly of the mono-crystal furnace.

Further, the cooling assembly of the water-cooled jacket comprises a water-cooled jacket and a first cooling channel disposed in the water-cooled jacket, and the second heat exchange channel, the first cooling channel, and the fourth heat exchange channel are communicated in sequence.

Further, the cooling assembly of the mono-crystal furnace comprises a mono-crystal furnace and a second cooling channel disposed in the mono-crystal furnace, and the second heat exchange channel, the second cooling channel, and the fourth heat exchange channel are communicated in sequence.

Further, both the first heat exchange mechanism and the second heat exchange mechanism are heat exchangers.

Further, the first fluid is air or pure water, and a temperature of the first fluid is less than that of the second fluid flowing out of the cooling assembly of the mono-crystal furnace.

Further, the second fluid is pure water, and a temperature of the second fluid entering the fourth heat exchange channel is less than that of the third fluid.

Further, the third fluid is air or pure water.

Further, the second fluid entering the second heat exchange channel exchanges heat with the first fluid in the first heat exchange channel, so that the second fluid is cooled; the second fluid entering the fourth heat exchange channel exchanges heat with the third fluid in the third heat exchange channel, so that the second fluid is heated.

Further, the second fluid entering the cooling assembly of the water-cooled jacket exchanges heat with the mono-crystal furnace and is heated; the second fluid entering the cooling assembly of the mono-crystal furnace exchanges heat with the mono-crystal furnace and is heated.

Methods for pulling a mono-crystal, which are carried out by using the above mentioned dual refrigeration systems used for a mono-crystal furnace, the method includes controlling a pulling speed of the mono-crystal during an isodiameter growing stage to be a first pulling speed during the process of pulling the mono-crystal;

controlling a temperature of a first fluid, so as to control a temperature of a second fluid after exchanging heat with the first fluid, so that a temperature of the second fluid entering a water-cooled jacket is a first temperature, and carrying out heat exchange between the second fluid with heat in the mono-crystal furnace to control a temperature gradient for growth of the mono-crystal; and controlling a temperature of a third fluid, so as to control a temperature of the second fluid after exchanging heat with a third fluid, so that there is a small difference between a temperature of the second fluid entering a furnace body of the mono-crystal furnace and a temperature in the mono-crystal furnace, thus controlling a temperature of the furnace body of the mono-crystal furnace to be lower than a second temperature.

Further, the first temperature ranges from 0° C. to 25° C., and the second temperature ranges from 40° C. to 50° C.

Further, a temperature of the first fluid ranges from 0° C. to 20° C., a temperature of the third fluid ranges from 30° C. to 50° C., and the first pulling speed ranges from 90 mm/h to 120 mm/h.

With the above technical solutions, the dual refrigeration system for a mono-crystal furnace has a simple structure and is convenient to use. The dual refrigeration system includes a first heat exchange assembly and a second heat exchange assembly. The first heat exchange assembly includes a first heat exchange mechanism capable of exchanging heat, a first heat exchange channel and a second heat exchange channel. Both the first heat exchange channel and the second heat exchange channel are communicated with the first heat exchange mechanism. The second heat exchange channel is communicated with the cooling assembly of the water-cooled jacket and the cooling assembly of the mono-crystal furnace, respectively. The second heat exchange assembly includes a second heat exchange mechanism, a third heat exchange channel and a fourth heat exchange channel. Both the third heat exchange channel and the fourth heat exchange channel are communicated with the second heat exchange mechanism. The fourth heat exchange channel is communicated with the cooling assembly of the water-cooled jacket and the cooling assembly of the mono-crystal furnace, respectively. The second heat exchange channel, the cooling assembly of the water-cooled jacket, the fourth heat exchange channel and the cooling assembly of the mono-crystal furnace constitute a circulation loop, in which the second fluid flows. The first fluid in the first heat exchange channel exchanges heat with the second fluid in the second heat exchange channel in the first heat exchange mechanism, and the second fluid is cooled. The second fluid in the fourth heat exchange channel exchanges heat with the third fluid in the third heat exchange channel in the second heat exchange mechanism, and the second fluid is heated, so that the second fluid flowing out from the cooling assembly of the water-cooled jacket has a relatively high temperature. The second fluid with high temperature flowing out of the cooling assembly of the water-cooled jacket exchanges heat with the third fluid with a higher temperature in the third heat exchange channel, so as to increase the temperature of the second fluid entering the cooling assembly of the mono-crystal furnace. The second fluid flows in the cooling assembly of the mono-crystal furnace, and exchanges heat with the mono-crystal furnace, and is heated again, while the temperature of the furnace body of the mono-crystal furnace is lowered, so that the second fluid entering the cooling assembly of the mono-crystal furnace has a higher temperature than that in the prior art. Thus the furnace body of the mono-crystal furnace will not take away excessive heat due to too low temperature. Meanwhile, the furnace body will not cause scalding to operators. The second fluid that is heated again enters the second heat exchange channel. A first fluid with a low temperature is introduced into the first heat exchange channel, and exchanges heat with the second fluid that is heated again in the second heat exchange channel, so that the temperature of the second fluid in the second heat exchange channel is lowered. The cooled second fluid exchanges heat with the mono-crystal furnace during flowing in the cooling assembly of the water-cooled jacket, so that heat on the surface of the mono-crystal surface is quickly dissipated, and excessive heat in the environment is taken away, thus the mono-crystal can be cooled faster, the growth rate of the mono-crystal is improved, and the effective capacity per unit time is increased. Meanwhile, the heat of the second fluid taken away by the water-cooling jacket continues to be heated through the fourth heat exchange channel, and then it is supplied to the furnace body, which ensures the high temperature required by the operation of the furnace body, achieving the purpose of reusing heat energy and reducing power consumption, thus not only ensuring the pulling speed, but also ensuring less heat lose to avoid energy consumption. Further, reuse of heat energy consumption saves the energy loss caused by extra heating, thus achieving the purpose of high efficiency and low energy consumption. It can not only improve the crystal growth efficiency, but also ensure lower energy loss and achieve the best energy utilization.

BRIEF DESCRIPTION OF THE DRAWINGS

FIG. 1 is a schematic structural diagram of an embodiment of the present disclosure.

LIST OF REFERENCE NUMBERS

| | |
|---|---|
| 1: First heat exchange channel | 2: Second heat exchange channel |
| 3: Cooling assembly of a water-cooled jacket | 4: Fourth heat exchange channel |
| 5: Third heat exchange channel | 6: Cooling assembly of a mono-crystal furnace |

DETAILED DESCRIPTION

The present disclosure will now be further described with reference to the accompanying drawings and specific embodiments.

FIG. 1 is a schematic structural diagram of an embodiment of the present disclosure. This embodiment relates to a dual refrigeration system used for a mono-crystal furnace and a method for pulling a mono-crystal, which are used for controlling the temperature in a mono-crystal furnace and the temperature in a water-cooled jacket during the process of pulling a mono-crystal, that is, controlling the temperature of the water-cooled jacket and the temperature of a furnace body of the mono-crystal furnace. A fluid with a higher temperature flowing out of a cooling assembly of a water-cooled jacket is heated through a heat exchange, and then enters a cooling assembly of the mono-crystal furnace, in which the fluid is further heated through another heat exchange, so that the fluid entering the cooling assembly of the mono-crystal furnace has a higher temperature, thus ensuring growth balance and less thermal stress of the mono-crystal in a high-temperature environment, ensuring growth efficiency of the mono-crystal, ensuring temperature in the furnace body of the mono-crystal furnace, avoiding energy loss caused by excessive heat loss of a thermal field, ensuring temperature gradient for growth of the mono-crystal and less loss of thermal energy, and effectively saving energy and reducing energy consumption.

In the melting stage of manufacturing mono-crystal silicon, it is necessary to melt solid polysilicon into silicon melt, and a mono-crystal furnace system needs to be heated to keep the operating temperature in the furnace at about 1400° C. to 1600° C. The material of the mono-crystal furnace is stainless steel. In order to protect the mono-crystal furnace from being damaged by high temperature, and to ensure that the temperature of the furnace body is not higher than a scalding temperature of human body, it is necessary to introduce circulating water into the cooling system of the mono-crystal furnace, so that the temperature of the furnace body is kept below 50° C., and the temperature of the mono-crystal furnace should not be too low. If the temperature of the mono-crystal furnace is too low, it will easily lead to heat loss. Therefore, it is necessary to control the temperature of the mono-crystal furnace during the Czochralski process.

After melting, the polysilicon melt needs to be solidified and grown into mono-crystal silicon at a temperature of 500° C. to 1400° C. In order to ensure growth balance and less thermal stress of the mono-crystal in the high-temperature environment, and to ensure growth efficiency of the mono-crystal, a water-cooled jacket is added above the mono-crystal silicon in the mono-crystal furnace to introduce circulating water for refrigeration. On the one hand, excess heat in the environment of the mono-crystal furnace is taken away, and on the other hand, heat on surface of the mono-crystal is quickly dissipated to ensure the temperature gradient required for crystal growth. The lower the temperature of the water-cooled jacket, the better, which can quickly take away the heat and increase temperature gradient of the crystal.

Therefore, in the crystal-pulling process, it is necessary to control the temperature of the water-cooled jacket and the temperature in the furnace body of the mono-crystal furnace, so as to avoid excessive heat being taken away by the furnace body of the mono-crystal furnace due to too low temperature, which will easily lead to excessive heat loss in the thermal field and cause energy loss. It is also necessary to avoid that the temperature of the water-cooled jacket is too high to meet the minimum temperature gradient for crystal growth.

A dual refrigeration system used for a mono-crystal furnace, as shown in FIG. 1, includes a cooling assembly of a water-cooled jacket 3, a cooling assembly of a mono-crystal furnace 6, a first heat exchange assembly, and a second heat exchange assembly. The cooling assembly of the water-cooled jacket 3 is used for keeping temperature of the water-cooled jacket. The cooling assembly of the mono-crystal furnace 6 is used for keeping temperature of the furnace body of the mono-crystal furnace. The first heat exchange assembly and the second heat exchange assembly are disposed to realize communication between the cooling assembly of the water-cooled jacket 3 and the cooling assembly of the mono-crystal furnace 6, and to control the temperature of fluid through heat exchange, thereby controlling the temperature of the cooling assembly of the water-cooled jacket 3 and the cooling assembly of the mono-crystal furnace 6. The first heat exchange assembly includes a first heat exchange mechanism capable of exchanging heat, a first heat exchange channel 1 and a second heat exchange channel 2, both the first heat exchange channel 1 and the second heat exchange channel 2 are communicated with the first heat exchange mechanism. Fluid in the first heat exchange channel 1 and fluid in the second heat exchange channel 2 can exchange heat in the first heat exchange mechanism, and the second heat exchange channel 2 is communicated respectively with the cooling assembly of the water-cooled jacket 3 and the cooling assembly of the mono-crystal furnace 6 to realize flowing of fluid.

The second heat exchange assembly includes a second heat exchange mechanism capable of exchanging heat, a third heat exchange channel 5 and a fourth heat exchange channel 4. Both the third heat exchange channel 5 and the fourth heat exchange channel 4 are communicated with the second heat exchange mechanism. Fluid in the third heat exchange channel 5 and fluid in the fourth heat exchange channel 4 can exchange heat in the second heat exchange mechanism, and the fourth heat exchange channel 4 is communicated respectively with the cooling assembly of the water-cooled jacket 3 and the cooling assembly of the mono-crystal furnace 6 to realize flowing of fluid.

Due to the arrangement of the second heat exchange channel 2 and the fourth heat exchange channel 4, the second heat exchange channel 2, the cooling assembly of the water-cooled jacket 3, and the fourth heat exchange channel 4 are sequentially communicated with the cooling assembly of the mono-crystal furnace 6, and they are communicated from end to end.

A first fluid is introduced into the first heat exchange channel and flows out therefrom. Both ends of the first heat exchange channel 1 are respectively communicated with the outside, the first fluid flows in from an inlet of the first heat exchange channel 1 and flows out from an outlet of the first heat exchange channel 1.

A second fluid is flowing circularly in the second heat exchange channel 2, the cooling assembly of the water-cooled jacket 3, the fourth heat exchange channel 4, and the cooling assembly of the mono-crystal furnace 6. The second fluid flows circularly along the second heat exchange channel 2, the cooling assembly of the water-cooled jacket 3, the fourth heat exchange channel 4, the cooling assembly of the mono-crystal furnace 6, and the second heat exchange channel 2 in sequence.

A third fluid is introduced into the third heat exchange channel 5 and flows out therefrom. Both ends of the third heat exchange channel 5 are respectively communicated with the outside, the third fluid flows in from an inlet of the third heat exchange channel 5 and flows out from an outlet of the third heat exchange channel 5.

The second fluid flows through the cooling assembly of the mono-crystal furnace 6, the second heat exchange channel 2, the cooling assembly of the water-cooled jacket 3, and the fourth heat exchange channel 4 in sequence. The second fluid exchanges heat with heat in the mono-crystal furnaces in both the cooling assembly of the water-cooled jacket 3 and the cooling assembly of the mono-crystal furnace 6, and maintains the temperature of the cooling assembly of the water-cooled jacket 3 and the cooling assembly of the mono-crystal furnace 6 during the crystal pulling process. The second fluid in the second heat exchange channel 2 exchanges heat with the first fluid in the first heat exchange channel 1 in the first heat exchange mechanism, so that temperature of the second fluid flowing out of the second heat exchange channel 2 can be controlled (that is, temperature of the second fluid entering the cooling assembly of the water-cooled jacket 3 can be controlled). The second fluid in the fourth heat exchange channel 4 exchanges heat with the third fluid in the third heat exchange channel 5 in the second heat exchange mechanism, so that temperature of the second fluid flowing out of the fourth heat exchange channel 4 can be controlled (that is, temperature of the second fluid entering the cooling assembly of the mono-crystal furnace 6 can be controlled).

The second fluid flows in the cooling assembly of the water-cooled jacket 3 and the cooling assembly of the mono-crystal furnace 6, and exchanges heat with high-temperature heat in the mono-crystal furnace during the flowing process, so as to keep temperature of the water-cooled jacket and temperature of the furnace body of the mono-crystal furnace, thus ensuring that heat on the surface of the mono-crystal silicon rod is quickly dissipated to ensure the temperature gradient required for crystal growth. Further, heat loss of the thermal field can be avoided, effectively saving energy and reducing energy consumption.

Both the first heat exchange mechanism and the second heat exchange mechanism are heat exchangers, which are commercially available products and can be selected according to actual requirements, and there are no specific limitations herein.

The cooling assembly of the water-cooled jacket 3 includes a water-cooled jacket and a first cooling channel disposed in the water-cooled jacket. The second heat exchange channel 2, the first cooling channel, and the fourth heat exchange channel 4 are communicated in sequence. The second fluid flows through the second heat exchange channel 2, the first cooling channel and the fourth heat exchange channel 4 in sequence. The second fluid flowing in the first cooling channel exchanges heat with heat in the mono-crystal furnace during the flowing process.

The above cooling assembly of the mono-crystal furnace 6 includes a mono-crystal furnace and a second cooling channel disposed in the mono-crystal furnace, and the second heat exchange channel 2, the second cooling channel, and the fourth heat exchange channel 4 are communicated in sequence. The second fluid flows through the fourth heat exchange channel 4, the second cooling channel, and the second heat exchange channel 2 in sequence. The second fluid flowing in the second cooling channel exchanges heat with heat in the mono-crystal furnace during the flowing process.

The first fluid is air or pure water, and a temperature of the first fluid is less than that of the second fluid flowing out of the cooling assembly of the mono-crystal furnace 6. In winter, the first fluid may be outdoor cold air. In other seasons, the first fluid may low-temperature pure water prepared by a refrigeration system, which can be selected according to the actual time and requirements, and there is no specific limitation herein.

The second fluid is pure water, and a temperature of the second fluid entering the fourth heat exchange channel 4 is less than that of the third fluid entering the third heat exchange channel 5.

The outlet of the first heat exchange channel 1 is connected with a refrigeration equipment, and the first fluid flowing out of the first heat exchange channel 1 is cooled, so that the first fluid can be reused, and the first fluid entering the first heat exchange channel 1 has a low temperature. The refrigeration equipment is a commercially available product, it can be selected according to actual requirements, and there is no specific limitation herein. Whether the refrigeration equipment is required depends on seasons.

The outlet of the third heat exchange channel 5 is connected with a heating equipment, and the third fluid flowing out of the third heat exchange channel 5 is heated, so that the third fluid can be reused, and the third fluid entering the third heat exchange channel 5 has a high temperature. The heating equipment is a commercially available product, it can be selected according to actual requirements, and there is no specific limitation herein. Whether the heating equipment is required depends on seasons.

The second fluid entering the second heat exchange channel 2 exchanges heat with the first fluid in the first heat exchange mechanism, so that the second fluid is cooled. The cooled second fluid enters the cooling assembly of the water-cooled jacket 3, exchanges heat with the mono-crystal furnace, and is heated. The second fluid entering the cooling assembly of the water-cooled jacket 3 has a relatively low temperature, so as to exchange heat with the pulled mono-crystal silicon rod, thus excessive heat in the environment around the mono-crystal silicon rod can be taken away, heat on the surface of the mono-crystal silicon rod can be quickly dissipated, and the temperature gradient required for crystal growth can be ensured. Further, the second fluid with lower temperature entering the cooling assembly of the water-cooled jacket 3 exchanges heat with the mono-crystal furnace, so that the second fluid flowing out of the cooling assembly of the water-cooled jacket 3 has a relatively high temperature, which enters the fourth heat exchange channel 4. The second fluid entering the fourth heat exchange channel 4 exchanges heat with the third fluid in the third heat exchange channel 5 in the second heat exchange mechanism. The second fluid entering the fourth heat exchange channel 4 is heated again. The heated second fluid enters the cooling assembly 6 of the mono-crystal furnace, and exchanges heat with the mono-crystal furnace, so that it is heated again. The second fluid entering the cooling assembly of the mono-crystal furnace 6 has a higher temperature, but this temperature is lower than the high temperature in the mono-crystal furnace. The second fluid flowing in the cooling assembly 6 of the mono-crystal furnace exchanges heat with the mono-crystal furnace at a high temperature, thus ensuring temperature of the furnace body of the mono-crystal furnace, and avoiding the heat loss caused by excessive heat taken away by the mono-crystal furnace due to too low temperature.

The second fluid with higher temperature flowing out of the cooling assembly of the water-cooled jacket 3 exchanges heat with the third fluid in the third heat exchange channel 5, and is heated again, so that the second fluid entering the second cooling channel of the cooling assembly of the mono-crystal furnace 6 has a higher temperature than that of the fluid entering the cooling assembly of the mono-crystal furnace 6 in the prior art, and temperature of the second fluid entering the cooling assembly of the mono-crystal furnace 6 is increased, thereby improving heat utilization rate of the fluid flowing out of the water-cooled jacket. Meanwhile, temperature of the mono-crystal furnace meets the requirements for use (below 50° C.), thereby effectively saving energy and reducing energy consumption.

When the dual refrigeration system used for a mono-crystal furnace starts, the second fluid may be introduced from the cooling assembly of the water-cooled jacket 3 or from the cooling assembly of the mono-crystal furnace 6. Alternatively, the second fluid may be introduced from the second heat exchange channel 2. Alternatively, the second fluid may be introduced from the fourth heat exchange channel 4. The introduction of the second fluid may be selected according to actual requirements, and there is no specific limitation herein.

When the dual-refrigeration system of the mono-crystal furnace is in operation, the water-cooled jacket in the cooling assembly of the water-cooled jacket 3 and the furnace body of the mono-crystal are cooled to ensure the temperature of the water-cooled jacket and the temperature of the furnace body of the mono-crystal furnace meet the requirements.

The type of the first fluid can be selected according to seasons. The first fluid is introduced into the first heat exchange channel 1, it flows through and out of the first heat exchange channel 1. The first fluid flowing out of the first heat exchange channel 1 is selected according to seasons whether to enter an external refrigeration device to be cooled for reuse.

A third fluid is introduced into the third heat exchange channel 5, it flows through and out of the third heat exchange channel 5. The third fluid flowing out from the third heat exchange channel 5 is selected according to seasons whether to enter an external heating device to be heated for reuse.

The first fluid introduced into the first heat exchange channel 1 has a relatively low temperature. The third fluid introduced into the third heat exchange channel 5 has a relatively high temperature. Preferable, it is at ambient temperature.

The second fluid enters the dual refrigeration system used for a mono-crystal furnace from the cooling assembly of the water-cooled jacket 3, and flows circularly along the first cooling channel of the cooling assembly of the water-cooled jacket 3, the fourth heat exchange channel 4, the second cooling channel of the cooling assembly of the mono-crystal furnace 6, and the second heat exchange channel 2. The second fluid flowing out of the cooling assembly of the mono-crystal furnace has a higher temperature, it enters the second heat exchange channel 2, and flows along the second heat exchange channel 2, then exchanges heat with the first fluid in the first heat exchange channel 1 in the first heat exchange mechanism, so that the second fluid is cooled and the first fluid is heated.

The cooled second fluid flows out from the second heat exchange channel, enters the cooling assembly of the water-cooled jacket 3, flows along the first cooling channel of the cooling assembly of the water-cooled jacket 3, and exchanges heat with heat in the mono-crystal furnace during the flowing process, thus the second fluid is heated. The temperature of the water-cooled jacket is maintained at 0° C. to 25° C., so that the water-cooled jacket can quickly take away heat on the surface of the mono-crystal silicon rod. Meanwhile, excessive heat around the mono-crystal silicon rod can be taken away, thereby ensuring the temperature gradient required for the growth of the mono-crystal silicon rod.

The heated second fluid flows out from the first cooling channel of the cooling assembly of the water-cooled jacket 3, enters the fourth heat exchange channel 4, flows in the fourth heat exchange channel 4, and exchanges heat with the third fluid in the third heat exchange channel 5 in the second heat exchange mechanism, so that the second fluid is heated, and the third fluid is cooled. The heated second fluid flows out from the fourth heat exchange channel 4, enters the cooling assembly of the mono-crystal furnace 6, flows in the second cooling channel of the cooling assembly of the mono-crystal furnace 6, and exchanges heat with heat in the mono-crystal furnace, thus the second fluid located in the second cooling channel is heated again, so that the temperature of the furnace body of the mono-crystal furnace is lowed. The temperature of the furnace body of the mono-crystal furnace is kept below 50° C., meanwhile the furnace body of the mono-crystal furnace will not have a too low temperature, so as to prevent the furnace body from taking too much heat due to the too low temperature, and meanwhile, the furnace body will not cause burns to operators.

The second fluid flowing out from the cooling assembly of the mono-crystal furnace 6 enters the second heat exchange channel 2, flows along the second heat exchange channel 2, and exchanges heat with the first fluid in the first heat exchange channel 1 in the first heat exchange mechanism, so that the second fluid is cooled, and the first fluid is heated.

The cooled second fluid flows out from the second heat exchange channel 2, enters the cooling assembly of the water-cooled jacket 3, and repeats the above-mentioned circulating flow and heat exchange. In this way, the second fluid cool the water-cooled jacket and the furnace body of the mono-crystal furnace to ensure that the temperature of the water-cooled jacket is 0° C. to 50° C., and the temperature of the furnace body of the mono-crystal furnace is maintained below 50° C., thereby ensuring the temperature gradient for crystal growth, and less loss of heat energy. Meanwhile, the second fluid with higher temperature flowing out of the cooling assembly of the water-cooled jacket 3 is heated to increase temperature of the second fluid through heat exchange in the second heat exchange assembly 3, and then enters the cooling assembly of the mono-crystal furnace 6. Energy can be effectively saved and consumption can be effectively reduced by increasing the temperature of the second fluid entering the mono-crystal furnace assembly 6.

A method for pulling a mono-crystal, which is carried out by using the above mentioned dual refrigeration system used for a mono-crystal furnace. The method includes controlling a pulling speed of the mono-crystal during an isodiameter growing stage to be a first pulling speed during the process of pulling the mono-crystal. The first pulling speed ranges from 90 mm/h to 120 mm/h, which can be selected according to actual requirements, and there is no specific limitation herein.

The method further includes controlling the temperature of the first fluid to be within a range from 0° C. to 20° C., so as to control a temperature of a second fluid after exchanging heat with the first fluid. In the first heat exchange assembly, the temperature of the first fluid is lower than that of the second fluid. After heat exchange, the second fluid is cooled, so that the temperature of the second fluid entering a water-cooled jacket is a first temperature ranging from 0° C. to 25° C. The first temperature is lower than the temperature in the mono-crystal furnace. The second fluid exchanges heat with the mono-crystal furnace, and is heated, so that heat on the surface of the mono-crystal and in the surrounding environment is taken away, and heat on the surface of the mono-crystal is quickly dissipated, so as to control the temperature gradient for growing mono-crystal silicon. Thus the mono-crystal can be cooled more quickly, growth rate of the mono-crystal is increased, pulling speed of the mono-crystal is increased, and effective capacity per unit time is increased as well. The temperature of the first fluid can be 0° C., 5° C., 10° C., 15° C., 20° C., or any other values within the range of 0° C. to 20° C., which can be selected according to actual requirements, and there is no specific limitation herein.

In this embodiment, the above process is continued in the whole mono-crystal pulling process. That is, the temperature of the water-cooled jacket is controlled in the whole mono-crystal pulling process to ensure that heat on the surface of the mono-crystal and in the surrounding environment is taken away during the mono-crystal pulling process, and heat on the surface of the mono-crystal is quickly dissipated, thus ensuring the temperature gradient for growth of mono-crystal, increasing the growth rate of the mono-crystal, and increasing the effective capacity per unit time.

The method further includes controlling the temperature of the third fluid to be within a range from 30° C. to 50° C., so as to control the temperature of the second fluid after exchanging heat with the third fluid. In the second heat exchange assembly, the third fluid has a temperature lower than that of the second fluid, thus the third fluid is heated, and the second fluid is cooled, so that there is a small difference between the temperature of the second fluid entering the furnace body of the mono-crystal furnace and the temperature in the mono-crystal furnace, which is 5° C. to 8° C., thus the second fluid entering the mono-crystal furnace body will not have a too low temperature. The second fluid in the mono-crystal furnace body exchanges heat with the mono-crystal furnace body, so as to control the temperature of furnace body of the mono-crystal furnace to be lower than the second temperature. The second temperature ranges from 40° C. to 50° C. The temperature of furnace body of the mono-crystal furnace is not higher than scalding temperature of human body, thus causing no damage to operators, taking away less heat, causing no energy loss, achieving the goal of high efficiency and low energy consumption, not only improving crystal growth efficiency, but also ensuring lower energy loss, and achieving the best energy consumption utilization. The temperature of the third fluid can be 30° C., 35° C., 40° C., 45° C., 50° C., or any other values within the range of 30° C. to 50° C., which can be selected according to actual requirements, and there is no specific limitation herein.

In this embodiment, the temperature of the furnace body of the mono-crystal furnace can be controlled in the whole crystal pulling process, but the most important thing is to control the temperature of the furnace body of the mono-crystal furnace in the melting stage, so as to achieve the effect of fast melting and reducing power consumption.

A specific embodiment will be described below.

In the mono-crystal pulling process, the second fluid circulates in the second heat exchange channel 2 of the first heat exchange assembly, the water-cooled jacket assembly, the fourth heat exchange channel 4 of the second heat exchange assembly, and the cooling assembly of the mono-crystal furnace 6.

In the whole mono-crystal pulling process, the temperature of the first fluid entering the first heat exchange channel 1 is controlled according to the preset temperature of the second fluid entering the cooling assembly of the water-cooled jacket 3, and the temperature of the second fluid entering the second heat exchange channel 2. The temperature of the second fluid actually entering the cooling assembly of the water-cooled jacket 3 is controlled by a heat exchanger. The temperature of the first fluid is 0° C.

In the first heat exchange assembly, the first fluid exchanges heat with the second fluid. After heat exchange, the first fluid is heated and flows out from the first heat exchange channel 1, and the second fluid is cooled to a temperature of 5° C. and enters the cooling assembly of the water-cooled jacket 3. In the cooling assembly of the water-cooled jacket 3, the second fluid exchanges heat with heat in the mono-crystal furnace, and is heated. The heated second fluid enters the fourth heat exchange channel 4, and the temperature of the second fluid entering the fourth heat exchange channel 4 is 20° C.

In the melting stage, the temperature of the third fluid entering the third heat exchange channel 5 is controlled according to the temperature of the second fluid entering the fourth heat exchange channel 4 and the preset temperature of the second fluid entering the furnace body of the mono-crystal furnace. The temperature of the second fluid actually entering the furnace body of the mono-crystal furnace is controlled by a heat exchanger. The temperature of the third fluid is 40° C.

In the second heat exchange assembly, the second fluid entering the fourth heat exchange channel 4 exchanges heat with the third fluid in the third heat exchange channel 5, the third fluid is cooled and flows out from the third heat exchange channel 5, and the second fluid in the fourth heat exchange channel 4 is heated. The temperature of the second fluid is 30° C.

The heated second fluid enters the cooling assembly of the mono-crystal furnace 6. In the cooling assembly of the mono-crystal furnace 6, the second fluid exchanges heat with heat in the mono-crystal furnace, and is heated. The temperature of the mono-crystal furnace body is lower than 50° C. The heated second fluid enters the second heat-exchanging channel 2 of the first heat-exchanging assembly. The above cycle is repeated.

The pulling speed of the mono-crystal during an isodiameter growing stage is controlled to be 100 mm/h.

In the mono-crystal pulling process, the temperature of the water-cooled jacket, the temperature of the furnace body of the mono-crystal furnace, and the pulling speed of the mono-crystal are controlled by the above method, so that the quality of the pulled mono-crystal is normal. Compared with the prior art, the pulling speed of the mono-crystal is increased by 9%, and the energy consumption of the mono-crystal furnace is decreased by 5%. The pulling speed of mono-crystal is increased and the power consumption of mono-crystal furnace is reduced by adopting the dual refrigeration system used for a mono-crystal furnace to pull a mono-crystal.

With the above technical solutions, the dual refrigeration system for a mono-crystal furnace has a simple structure and is convenient to use. The dual refrigeration system includes a first heat exchange assembly and a second heat exchange assembly. The first heat exchange assembly includes a first heat exchange mechanism capable of exchanging heat, a first heat exchange channel and a second heat exchange channel. Both the first heat exchange channel and the second heat exchange channel are communicated with the first heat exchange mechanism. The second heat exchange channel is communicated with the cooling assembly of the water-cooled jacket and the cooling assembly of the mono-crystal furnace, respectively. The second heat exchange assembly includes a second heat exchange mechanism, a third heat exchange channel and a fourth heat exchange channel. Both the third heat exchange channel and the fourth heat exchange channel are communicated with the second heat exchange mechanism. The fourth heat exchange channel is communicated with the cooling assembly of the water-cooled jacket and the cooling assembly of the mono-crystal furnace, respectively. The second heat exchange channel, the cooling assembly of the water-cooled jacket, the fourth heat exchange channel and the cooling assembly of the mono-crystal furnace constitute a circulation loop, in which the second fluid flows. The first fluid in the first heat exchange channel exchanges heat with the second fluid in the second heat exchange channel in the first heat exchange mechanism, and the second fluid is cooled. The second fluid in the fourth heat exchange channel exchanges heat with the third fluid in the third heat exchange channel in the second heat exchange mechanism, and the second fluid is heated, so that the second fluid flowing out from the cooling assembly of the water-cooled jacket has a relatively high temperature. The second fluid with high temperature flowing out of the cooling assembly of the water-cooled jacket exchanges heat with the third fluid with a higher temperature in the third heat exchange channel, so as to increase the temperature of the second fluid entering the cooling assembly of the mono-crystal furnace. The second fluid flows in the cooling assembly of the mono-crystal furnace, and exchanges heat with the mono-crystal furnace, and is heated again, while the temperature of the furnace body of the mono-crystal furnace is lowered, so that the second fluid entering the cooling assembly of the mono-crystal furnace has a higher temperature than that in the prior art. Thus the furnace body of the mono-crystal furnace will not take away excessive heat due to too low temperature. Meanwhile, the furnace body will not cause scalding to operators. The second fluid that is heated again enters the second heat exchange channel. A first fluid with a low temperature is introduced into the first heat exchange channel, and exchanges heat with the second fluid that is heated again in the second heat exchange channel, so that the temperature of the second fluid in the second heat exchange channel is lowered. The cooled second fluid exchanges heat with the mono-crystal furnace during flowing in the cooling assembly of the water-cooled jacket, so that heat on the surface of the mono-crystal surface is quickly dissipated, and excessive heat in the environment is taken away, thus the mono-crystal can be cooled faster, the growth rate of the mono-crystal is improved, and the effective capacity per unit time is increased. Meanwhile, the heat of the second fluid taken away by the water-cooling jacket continues to be heated through the fourth heat exchange channel, and then it is supplied to the furnace body, which ensures the high temperature required by the operation of the furnace body, achieving the purpose of reusing heat energy and reducing power consumption, thus not only ensuring the pulling speed, but also ensuring less heat lose to avoid energy consumption. Further, reuse of heat energy consumption saves the energy loss caused by extra heating, thus achieving the purpose of high efficiency and low energy consumption. It can not only improve the crystal growth efficiency, but also ensure lower energy loss and achieve the best energy utilization.

Embodiments of the present disclosure have been described in detail above, but the contents are merely preferred embodiments of the present disclosure, which are not intended to limit scope of implementation of the present disclosure. All equivalent changes and modifications made in accordance with the scope of the present disclosure shall still fall within the scope of the present disclosure.

What is claimed is:

1. A dual refrigeration system for a mono-crystal furnace, comprising a cooling assembly of a water-cooled jacket, a cooling assembly of the mono-crystal furnace, a first heat exchange assembly, and a second heat exchange assembly, wherein the first heat exchange assembly comprises a first heat exchange mechanism capable of exchanging heat, a first heat exchange channel and a second heat exchange channel, both the first heat exchange channel and the second heat exchange channel are communicated with the first heat exchange mechanism, and the second heat exchange channel is communicated with the cooling assembly of the water-cooled jacket and the cooling assembly of the mono-crystal furnace, respectively;

the second heat exchange assembly comprises a second heat exchange mechanism capable of exchanging heat, a third heat exchange channel and a fourth heat exchange channel, both the third heat exchange channel and the fourth heat exchange channel are communicated with the second heat exchange mechanism, and the fourth heat exchange channel is communicated with the cooling assembly of the water-cooled jacket and the cooling assembly of the mono-crystal furnace, respectively;

a first fluid is introduced into the first heat exchange channel and flows out therefrom;

a second fluid is circulated in the second heat exchange channel, the cooling assembly of the water-cooled jacket, the fourth heat exchange channel, and the cooling assembly of the mono-crystal furnace;

a third fluid is introduced into the third heat exchange channel and flows out therefrom;

during the circular flowing process, the second fluid exchanges heat with the first fluid from the first heat exchange channel in the first heat exchange mechanism, exchanges heat with a mono-crystal furnace in the cooling assembly of the water-cooled jacket, exchanges heat with the third fluid from the third heat exchange channel in the second heat exchange mechanism, and exchanges heat with a mono-crystal furnace in the cooling assembly of the mono-crystal furnace; and the first heat exchange assembly, the cooling assembly of the water-cooled jacket, and the second heat exchange assembly, and the cooling assembly of the mono-crystal furnace are sequentially communicated through the second heat exchange channel and the fourth heat exchange channel, and are communicated from end to end.

2. The dual refrigeration system for a mono-crystal furnace according to claim 1, wherein the cooling assembly of the water-cooled jacket comprises a water-cooled jacket and a first cooling channel disposed in the water-cooled jacket, and the second heat exchange channel, the first cooling channel, and the fourth heat exchange channel are communicated in sequence.

3. The dual refrigeration system for a mono-crystal furnace according to claim 2, wherein the cooling assembly of the mono-crystal furnace comprises a mono-crystal furnace and a second cooling channel disposed in the mono-crystal furnace, and the second heat exchange channel, the second cooling channel, and the fourth heat exchange channel are communicated in sequence.

4. The dual refrigeration system for a mono-crystal furnace according to claim 1, wherein both the first heat exchange mechanism and the second heat exchange mechanism are heat exchangers.

5. The dual refrigeration system for a mono-crystal furnace according to claim 4, wherein the first fluid is air or water without impurities, and a temperature of the first fluid is less than that of the second fluid flowing out of the cooling assembly of the mono-crystal furnace.

6. The dual refrigeration system for a mono-crystal furnace according to claim 5, wherein the second fluid is water without impurities, and a temperature of the second fluid entering the fourth heat exchange channel is less than that of the third fluid.

7. The dual refrigeration system used for a mono-crystal furnace according to claim 6, wherein the third fluid is air or water without impurities.

8. The dual refrigeration system for a mono-crystal furnace according to claim 5, wherein the second fluid entering the second heat exchange channel exchanges heat with the first fluid in the first heat exchange channel, so that the second fluid is cooled; the second fluid entering the fourth heat exchange channel exchanges heat with the third fluid in the third heat exchange channel, so that the second fluid is heated.

9. The dual refrigeration system for a mono-crystal furnace according to claim 8, wherein the second fluid entering the cooling assembly of the water-cooled jacket exchanges heat with the mono-crystal furnace and is heated; the second fluid entering the cooling assembly of the mono-crystal furnace exchanges heat with the mono-crystal furnace and is heated.

10. The dual refrigeration system for a mono-crystal furnace according to claim 2, wherein both the first heat exchange mechanism and the second heat exchange mechanism are heat exchangers.

11. The dual refrigeration system for a mono-crystal furnace according to claim 3, wherein both the first heat exchange mechanism and the second heat exchange mechanism are heat exchangers.

12. The dual refrigeration system for a mono-crystal furnace according to claim 6, wherein the second fluid entering the second heat exchange channel exchanges heat with the first fluid in the first heat exchange channel, so that the second fluid is cooled; the second fluid entering the fourth heat exchange channel exchanges heat with the third fluid in the third heat exchange channel, so that the second fluid is heated.

13. A method for pulling a mono-crystal, wherein the method is carried out by using the dual refrigeration system used for a mono-crystal furnace according to claim 1, and the method comprises controlling a pulling speed of the mono-crystal during an isodiameter growing stage to be a first pulling speed during the process of pulling the mono-crystal;

controlling a temperature of a first fluid, so as to control a temperature of a second fluid after exchanging heat with the first fluid, so that a temperature of the second fluid entering a water-cooled jacket is a first temperature, and taking out heat exchange between the second fluid with the mono-crystal furnace to control a temperature gradient for growth of the mono-crystal; and controlling a temperature of a third fluid, so as to control a temperature of the second fluid after exchanging heat with a third fluid, so that difference between a temperature of the second fluid entering a furnace body of the mono-crystal furnace and a temperature in the mono-crystal furnace is reduced, thus controlling a temperature of the furnace body of the mono-crystal furnace to be lower than a second temperature.

14. The method according to claim 13, wherein the first temperature ranges from 0° C. to 25° C., and the second temperature ranges from 40° C. to 50° C.

15. The method according to claim 14, wherein a temperature of the first fluid ranges from 0° C. to 20° C., a temperature of the third fluid ranges from 30° C. to 50° C., and the first pulling speed ranges from 90 mm/h to 120 mm/h.

* * * * *